United States Patent
Bae et al.

(10) Patent No.: US 7,238,234 B2
(45) Date of Patent: *Jul. 3, 2007

(54) DEVICE AND METHOD FOR FABRICATING DISPLAY PANEL HAVING INK-JET PRINTING APPLIED THERETO

(75) Inventors: Bum Jin Bae, Seoul (KR); Eun A Moon, Seoul (KR); Young Jae Cho, Seoul (KR); Ji Hoon Sohn, Kyunggi-do (KR); Byung Gil Ryu, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/286,767

(22) Filed: Nov. 23, 2005

(65) Prior Publication Data

US 2006/0073268 A1    Apr. 6, 2006

Related U.S. Application Data

(63) Continuation of application No. 10/322,313, filed on Dec. 17, 2002, now Pat. No. 6,997,990.

(30) Foreign Application Priority Data

Apr. 8, 2002   (KR) ............ 10-2002-0018968

(51) Int. Cl.
B05B 3/00   (2006.01)
B05B 13/02  (2006.01)
B05B 15/02  (2006.01)
B05B 7/06   (2006.01)
B41J 2/165  (2006.01)

(52) U.S. Cl. .......... 118/302; 118/325; 118/713; 118/305; 118/313; 118/46; 347/19; 347/29; 347/33; 347/38

(58) Field of Classification Search ........ 118/305, 118/713, 313, 323, 679, 314, 46; 347/19, 347/2, 8, 104, 29, 33, 38; 445/24

See application file for complete search history.

(56) References Cited

U.S. PATENT DOCUMENTS 6,660,332 B2 * 12/2003 Kawase et al. ............ 427/266
6,799,826 B2 * 10/2004 Moon et al. ................ 347/19
6,997,990 B2 *  2/2006 Bae et al. .................. 118/325

* cited by examiner

Primary Examiner—Yewebdar Tadesse
(74) Attorney, Agent, or Firm—Lee, Hong, Degerman, Kang & Schmadeka

(57) ABSTRACT

Device and method for fabricating a display panel having ink-jet printing applied thereto, the device including a stage for supporting a substrate, a base having one or more than one rail for transporting the stage, and one or more than one ink-jet head rotatable by an angel for spraying a pattern forming solution to the substrate, thereby reducing a fabrication cost and simplifying a fabrication process.

16 Claims, 7 Drawing Sheets moving direction of substrate
Dummy pattern

DEVICE AND METHOD FOR FABRICATING DISPLAY PANEL HAVING INK-JET PRINTING APPLIED THERETO

This application is a continuation of Ser. No. 10/322,313, filed on Dec. 17, 2002, now U.S Pat. No. 6,997,990, claims the benefit of the Korean Application No. P2002-18968 filed on Apr. 8, 2002, which is hereby incorporated by reference.

BACKGROUND OF THE INVENTION

1. Field of the Invention

The present invention relates to device and method for fabricating a display panel, more particularly, to device and method for fabricating a display panel having ink-jet printing applied thereto for reducing a production cost and simplifying a fabrication process of a panel.

2. Background of the Related Art

In general, cathode-ray tubes (CRT) have been used mostly as displays. However, following digitization of information, a new concept of displays is required. For an example, compact displays with low power consumption are required in an environment requiring mobility, such as cars, or airplanes, or portable computers, and large sized displays with high luminance, and width angle of view are required in an environment in which delivery of information to the mass of people is required.

Recently, researches and development for flat panel displays (FPD) are in progress actively as displays suitable for a variety of environments as explained above. As the flat panel displays, there are liquid crystal display (LCD), plasma display panels (PDP), field emitter displays (FED), and electroluminescent displays (ELD).

However, for putting the displays into practical use, it is required that the fabrication processes of the displays are simplified for dropping a fabrication cost. Particularly, cost reduction of the panel pattern fabrication process which requires expensive equipment and complicate fabrication steps is very keen.

In a related art patterning, photolithography and screen printing are used mostly. Though thin and even pattern is available, the photolithography has a high material cost, and complicated fabrication process, as many fabrication steps, such as deposition, masking, etching, and the like, are required. Though the fabrication process is simple, and fabrication equipment is not expensive compared to the photolithography, the thin and even pattern is available from the screen print.

SUMMARY OF THE INVENTION

Accordingly, the present invention is directed to device and method for fabricating a display panel having ink-jet printing applied thereto that substantially obviates one or more of the problems due to limitations and disadvantages of the related art.

An object of the present invention is to provide device and method for fabricating a display panel having ink-jet printing applied thereto, which can reduce fabrication cost and simplify process steps.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the device for fabricating a display panel having ink-jet printing applied thereto includes a stage for supporting a substrate, a base having one or more than one rail for transporting the stage, and one or more than one ink-jet head rotatable by an angel for spraying a pattern forming solution to the substrate.

The angle of rotation of the ink-jet head are controlled by head controlling means according to intervals of patterns intended to form.

The head control means includes head holders each for holding the ink-jet heads, and two support plates for supporting the head holders.

The head control means includes head holders each for holding the ink-jet heads, and gears each connected to a center shaft of one of the head holders and engaged with each other for rotating the head holders.

The device for fabricating a display panel having ink-jet printing applied thereto further includes cleaning means for cleaning and capping the ink-jet heads, a plurality of CCD cameras and monitors for monitoring positions of the substrate and the ink-jet heads and spraying action (state) of the ink-jet heads, and a head support having rails for transporting the ink-jet heads.

In another aspect of the present invention, there is provided a device for fabricating a display panel having ink-jet printing applied thereto including a stage for supporting a substrate, a base having one or more than one rail for transporting the stage, and ink-jet heads each having a plurality of nozzles for spraying a pattern forming solution to the substrate, head controlling means for turning the ink-jet heads by a preset angle according to intervals of patterns intended to form, cleaning means for cleaning the ink-jet heads, and one or more than one camera for monitoring the substrate and the nozzles.

The stage includes an upper plate, a lower plate, and rails between the upper and lower plate running perpendicular to rails on the base.

The head controlling means turns the ink-jet heads by a preset angle with reference to a direction perpendicular to a length direction of the patterns intended to form, and the head controlling means turns the ink-jet heads the greater as the intervals between the patterns the smaller.

The head controlling means includes head holders for holding the ink-jet heads, two support plates for supporting the head holders.

The head control means includes head holders each for holding the ink-jet heads, and gears each connected to a center shaft of one of the head holders and engaged with each other for rotating the head holders.

The ink-jet head is movable in up/down directions.

The cleaning means is movable along the rails on the base for capping the nozzles when the ink-jet heads are not in use.

In further aspect of the present invention, there is provided a method for fabricating a display panel having an ink-jet printing applied thereto, including the steps of setting ink-jet heads with the ink-jet heads turned by a preset angle with reference to a direction perpendicular to a length direction of the patterns according to intervals of patterns intended to form, monitoring positions of the nozzles of the ink-jet heads, aligning a substrate on a stage, and spraying a pattern forming solution onto the substrate through nozzles in the ink-jet heads while moving the substrate.

The setting step includes the step of setting a number of the ink-jet heads according to a number of the patterns intended to form, and the setting step includes the step of setting the angle the greater as the intervals between the patterns intended to form are the smaller.

The step of monitoring includes the step of CCD cameras monitoring positions of a first nozzle and a last nozzle of each of the ink-jet heads.

The method for fabricating a display panel having an ink-jet printing applied thereto further includes the step of cleaning the nozzles after the step of setting, the step of patterning a dummy for testing nozzles before the step of spraying, and the step of heat treatment for hardening the pattern forming solution after the step of spraying.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
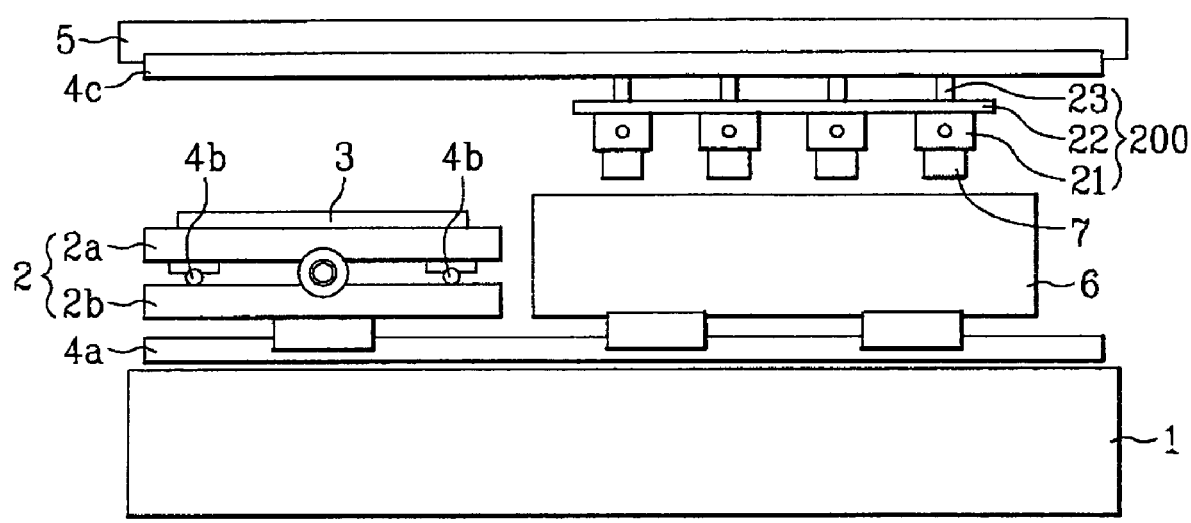
FIG. 1 illustrates a side view of a device for fabricating a display panel having ink-jet printing applied thereto in accordance with a preferred embodiment of the present invention.

Reference will now be made in detail to the preferred embodiments of the present invention, examples of which are illustrated in the accompanying drawings. FIG. 1 illustrates a side view of a device for fabricating a display panel having ink-jet printing applied thereto in accordance with a preferred embodiment of the present invention;

Referring to FIG. 1, the device for fabricating a display panel having ink-jet printing applied thereto includes a stage 2 for supporting a substrate 3, a base 1 having one or more than one rail 4a for transporting the stage 2, one or more than one ink-jet heads 7 each rotatable and movable in up/down direction and having a plurality of nozzles for spraying solution for forming a pattern on the substrate 3, head control means 200 for controlling a rotation angle of the ink-jet head 7 according to an interval of patterns intended to form, and cleaning means 6 for wiping and capping the nozzles.

The substrate 3 may be a plastic substrate having a coat of ITO (Indium Tin Oxide), and the solution of forming the pattern may be one of solutions for forming patterns of a display panel, such as a color filter layer, an alignment film, fluorescent material, electrodes, dielectric layer, and the like.

The stage 2 includes an upper plate 2a, and a lower plate 2b, and rails 4b running perpendicular to rails 4a on the base 1 between the upper and lower plates 2a and 2b. Since the rails 4a and 4b are running in perpendicular to each other, the upper plate 2a can be moved in left/right directions one the rails 4a and 4b. Therefore, the substrate 3 and the ink-jet heads 7 can be aligned, accurately.

The ink-jet head 7 is movable along a rail 4c attached to a head support 5 during patterning, as well as in up/down directions for adjusting a gap between the ink-jet head 7 and the substrate 3 according to the up/down movement of the head support 5. 1~100 ink-jet heads may be fitted according to the pattern the user intends to form, and the pattern can be formed by one flow of process.

Figure 2:
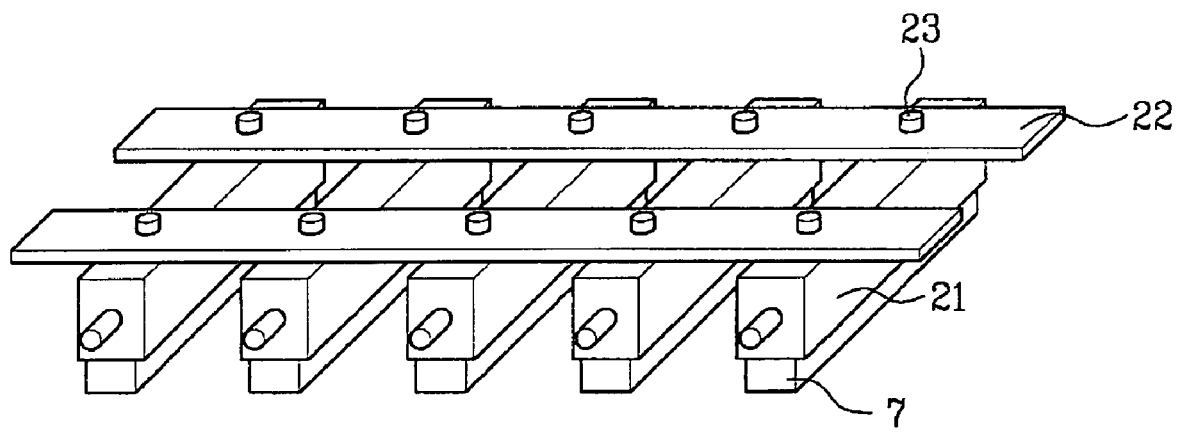
FIG. 2 illustrates head control means in a device for fabricating a display panel having ink-jet printing applied thereto in accordance with a first preferred embodiment of the present invention.
Figure 3:
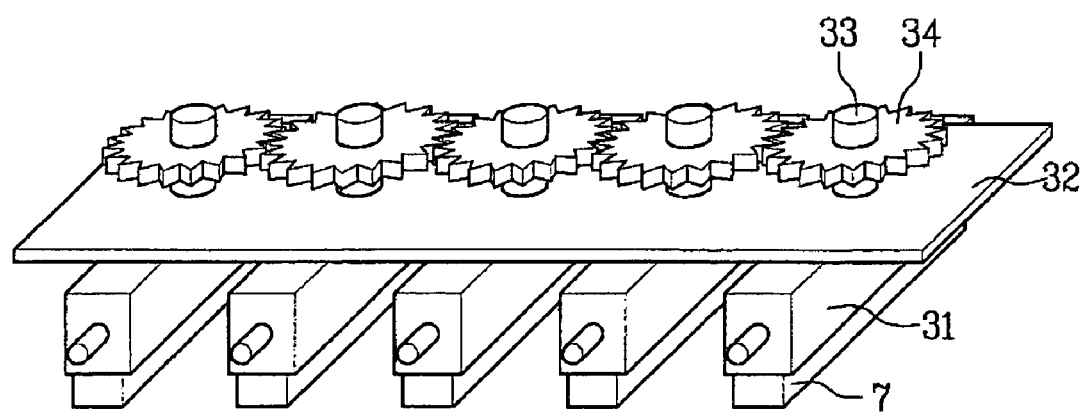
FIG. 3 illustrates head control means in a device for fabricating a display panel having ink-jet printing applied thereto in accordance with a second preferred embodiment of the present invention.

FIG. 2 illustrates head control means in a device for fabricating a display panel having ink-jet printing applied thereto in accordance with a first preferred embodiment of the present invention, and FIG. 3 illustrates head control means in a device for fabricating a display panel having ink-jet printing applied thereto in accordance with a second preferred embodiment of the present invention.

Referring to FIG. 2, the first embodiment head control means 200 includes head holders 21 each for holding an ink-jet head 7, and two support plates 22 each connected to a shaft 23 of the head holder 21 for supporting the head holder 21. When the two support plates 22 move in opposite directions, the ink-jet heads 7 turn at an angle with reference to a direction perpendicular to a length direction of the pattern intended to form.

Also, referring to FIG. 3, the second embodiment head control means 200 includes head holders 31 each for holding an ink-jet head 7, gears 34 engaged with each other each connected to a central shaft 33 of the head holder 31 for turning the head holders 31, and a support plate 32 between the head holders 31 and the gears 34.

The first, or second embodiment head control means 200 can turn the ink-jet heads 7 at the same angle.

Figure 7:
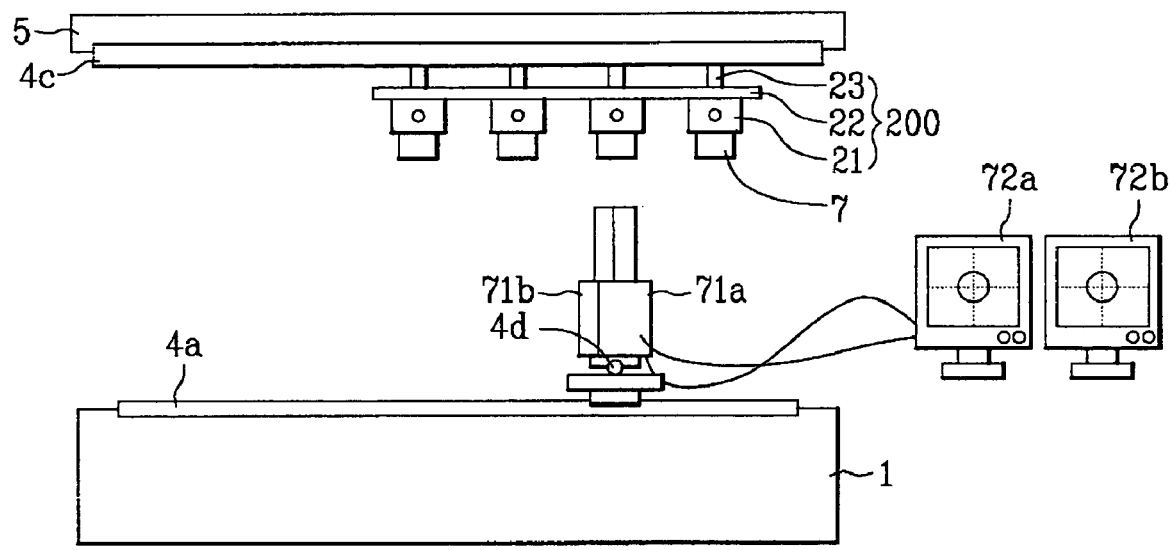
FIG. 7 illustrates a step for monitoring a position of an ink-jet head of the present invention.
Figure 8:
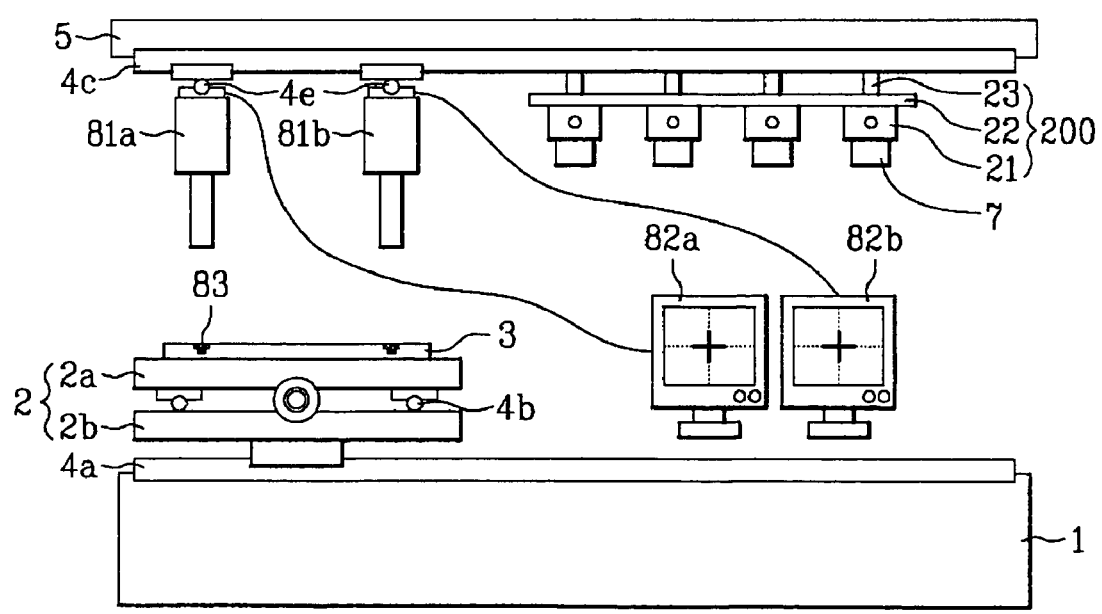
FIG. 8 illustrates a step for monitoring a position of a substrate of the present invention.
Figure 9:
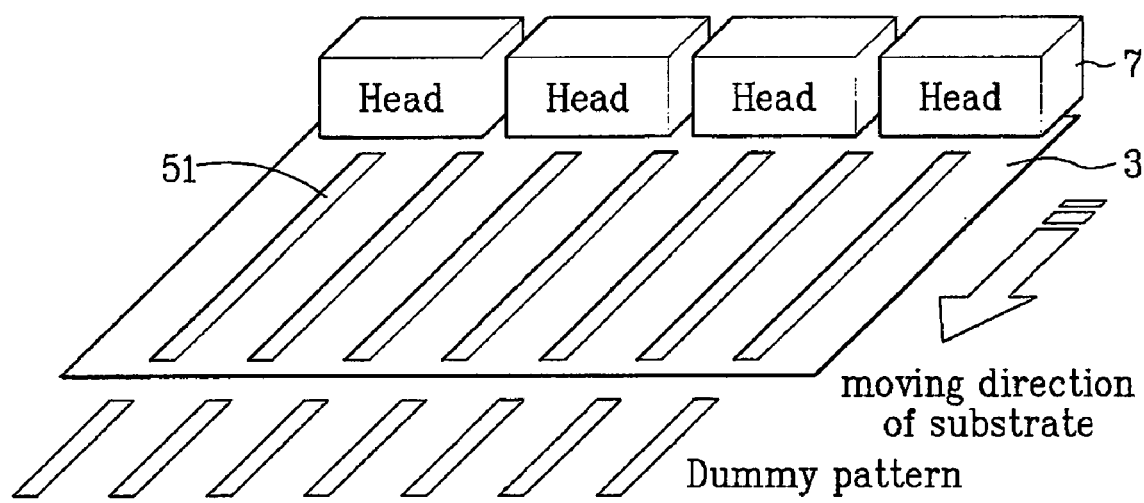
FIG. 9 illustrates a step for pattering a dummy of the present invention.

Also, referring to FIGS. 7, 8, and 9, a device for fabricating a display panel having an ink-jet printing applied thereto of the present invention may further includes CCD cameras 71a, and 71b and monitors 72a and 72b for monitoring positions of the nozzles at the ink-jet heads 7, CCD cameras 81a, and 81b and monitors 82a, and 82b for monitoring a position of the substrate 3, and a CCD camera 91c and monitor (not shown) for monitoring a spray state the nozzles of the ink-jet head 7 spray a pattern solution.

Figure 4:
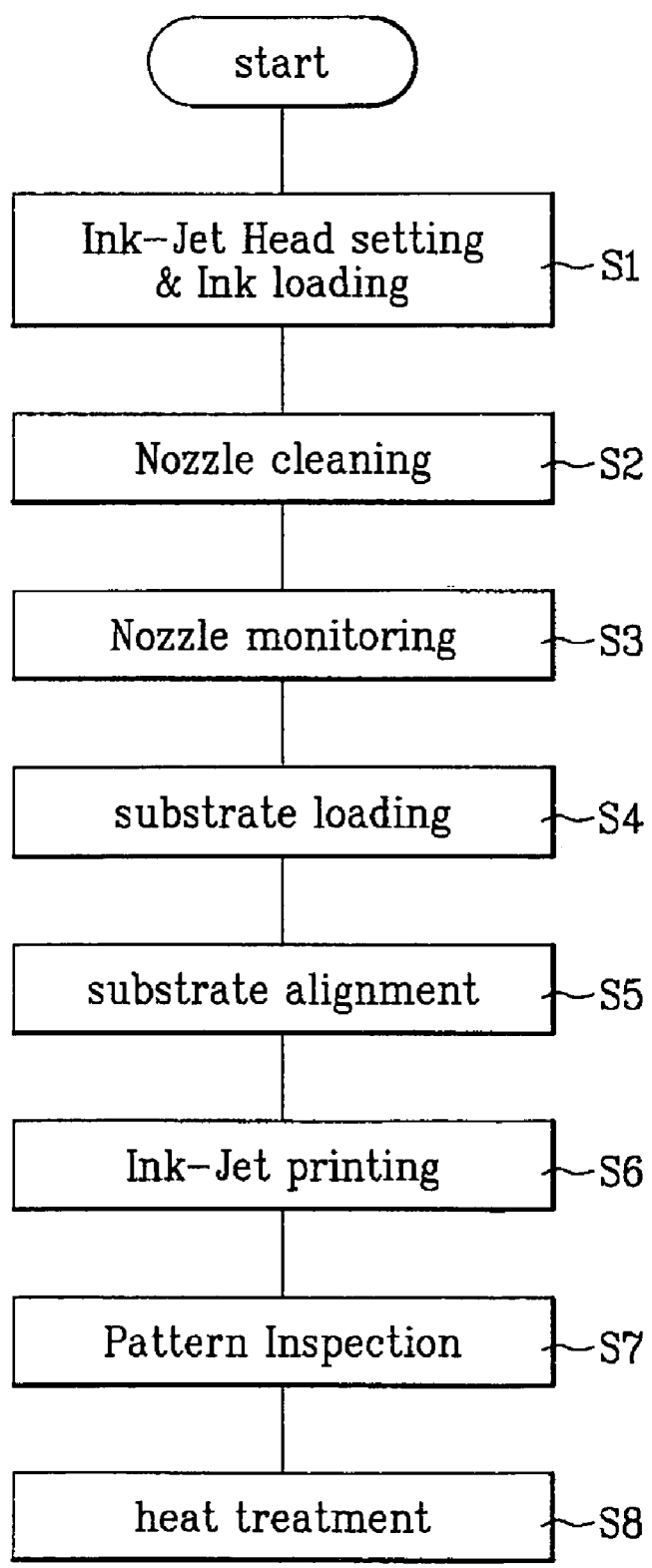
FIG. 4 illustrates a flow chart showing the step of a method for fabricating a display panel having ink-jet printing applied thereto in accordance with a preferred embodiment of the present invention.

A method for fabricating a pattern of a display panel by using the foregoing device for fabricating a display panel having an ink-jet printing applied thereto will be explained. FIG. 4 illustrates a flow chart showing the step of a method for fabricating a pattern of a display panel having ink-jet printing applied thereto in accordance with a preferred embodiment of the present invention.

At first, a plurality of ink-jet heads 7 are set, and a solution for forming a pattern is loaded on ink-jet heads 7 from a tube (not shown) for storing the solution (S1). 1~100 ink-jet heads 7 may be fitted according to a number of patterns 51 to be formed. For an example, if it is intended to form 320 patterns 51 by using ink-jet heads 7 each having 32 nozzles by one pass of flow, 10 ink-jet heads 7 are required.

Figure 5:
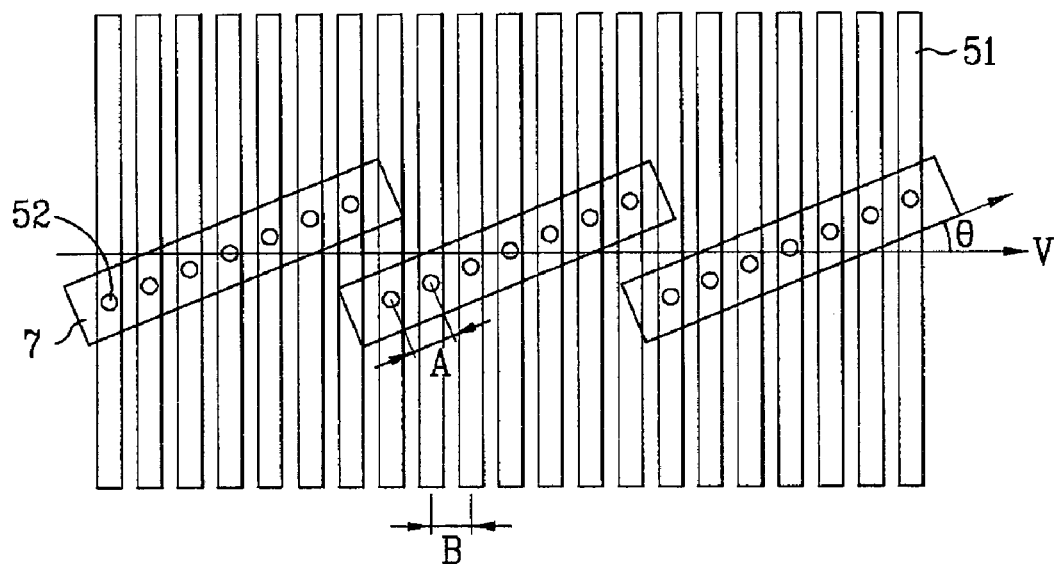
FIG. 5 illustrates an arrangement of ink-jet heads in a device for fabricating a display panel having ink-jet printing applied thereto in accordance with a preferred embodiment of the present invention.

Referring to FIG. 5, the ink-jet heads 7 are turned by a required angle θ according to intervals of the patterns 51 intended to form, such that the ink-jet heads 7 are arranged oblique with reference to a direction V perpendicular to a length direction of the patterns 51. The ink-jet heads 7 are arranged oblique for bringing the nozzles 52 to positions of the patterns 51, when intervals 'A' of the nozzles 52 are greater than intervals 'B' of the patterns 51.

The oblique angle θ of the ink-jet heads 7 with reference to the direction 'V' perpendicular to a length direction of the patterns 51 intended to form is varied with the intervals 'B' of the patterns, i.e., a resolution of the display.

Figure 6:
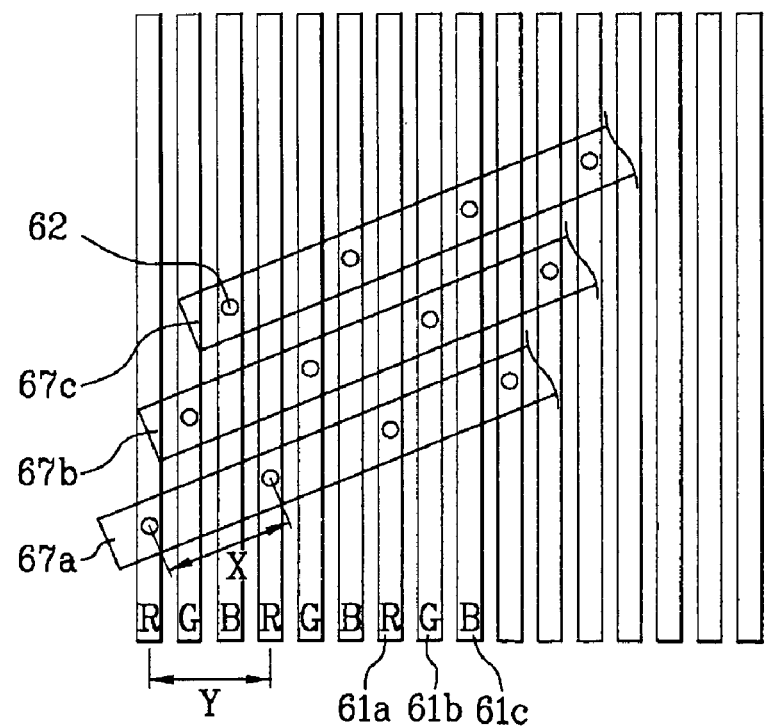
FIG. 6 illustrates an arrangement of ink-jet heads in a device for fabricating a display panel having ink-jet printing applied thereto in accordance with another preferred embodiment of the present invention.

For an example, referring to FIG. 6, a color filter layer of a PDP, or LCD has R, G, B patterns 61a, 61b, 61c repeatedly arranged at fixed intervals. In a case of 40" display with a VGA (Video Graphics Array) class resolution, the intervals 'Y' between the same color patterns are approx. 1.2 μm. Therefore, as intervals 'X' of the nozzles 62 of the ink-jet heads 67a, 67b, 67c for spraying three kinds of solutions for forming the R, G, B patterns 61a, 61b, 61c are approx. 1.4 μm, for bringing the nozzles 62 to relevant positions of the patterns, it is required that the ink-jet heads 67a, 67b, 67c are arranged oblique by approx. 32° with reference to a direction perpendicular to a length direction, of the R, G, B patterns 61a, 61b, 61c.

In a case of a display with a WXGA class resolution of a resolution higher than the display with a VGA class resolution, for bringing the nozzles 62 to relevant positions of the patterns, it is required that the ink-jet heads 67a, 67b, 67c are arranged oblique by approx. 62° with reference to a direction perpendicular to a length direction of the R, G, B patterns 61a, 61b, 61c. This is because the intervals of R, G, B patterns of the WXGA class are smaller than the intervals of the R, G, B patterns of the VGA class. That is, the higher the resolution of a display, the greater the oblique angle of the ink-jet heads 67a, 67b, and 67c.

Then, nozzles of the ink-jet heads 7 are cleaned S2, by bringing the cleaning means 6 under the ink-jet heads 7 along the rail, and wiping nozzle surfaces, for removing foreign matters stuck to the nozzles and improving meniscus of the nozzles 52.

In the cleaning, if the cleaning means 6 does not move, and, instead, the ink-jet heads 7 move, defective spraying of the ink-jet heads 7 may be caused by washing of the pattern forming solution in the ink-jet heads 7. Therefore, it is preferably that the cleaning means 6 is brought under the ink-jet head 7.

Then, referring to FIG. 7, when the cleaning process is finished, position accuracy of the nozzles 52 of the ink-jet heads 7 are monitored by using CCD cameras 71a and 71b and monitors 72a and 72b (S3). If the positions of the nozzles 52 are not accurate, the nozzles 52 are re-arranged. Since the CCD camera 71a and 71b are movable along the rails 4a and 4b in left/right directions, the nozzles 52 can be monitored in succession. In order to reduce a fabrication time period, the CCD cameras 71a and 71b may monitor positions of a first and last nozzles of each of the ink-jet heads 7. Moreover, since the ink-jet heads 7 are movable in up/down directions, a distance between the nozzles 52 and the substrate 3 may be adjusted.

Then, referring to FIG. 8, after arranging positions of the nozzles 52 accurately, the substrate 3 is placed on an upper plate 2a, an X-Y stage (S4), the substrate 3 is brought to a set position on the upper plate 2a (S5). In this instance, positions of marks 83 on the substrate 3 of being at the set positions on the upper plate 2a are verified by using the CCD cameras 81a and 81b and the monitors 82a and 82b.

Then, referring to FIG. 9, for testing whole nozzles 52 of the ink-jet heads 7, dummy pattern is formed, because most of abnormal signs occur, not while the nozzles 52 spray the pattern forming solution, but when the nozzles 52 start to spray the pattern forming solution. The foreign matters at the entrance of the nozzles 32 may be removed by the dummy patterning.

Then, the nozzles 52 spray pattern forming solution onto the substrate 3 while the substrate 3 is moved along the rail 4a by the stage 2 (S6). In this instance, it is required that a viscosity of the pattern forming solution is adjusted taking step coverage of the patterns intended to form into account. That is, when it is intended to form a pattern having a good step coverage, the viscosity of the pattern forming solution is increased, and vice versa. Thus, the device for fabricating a display panel having an ink-jet printing applied thereto of the present invention can improve a pattern step coverage and can form uniform patterns.

Figure 10:
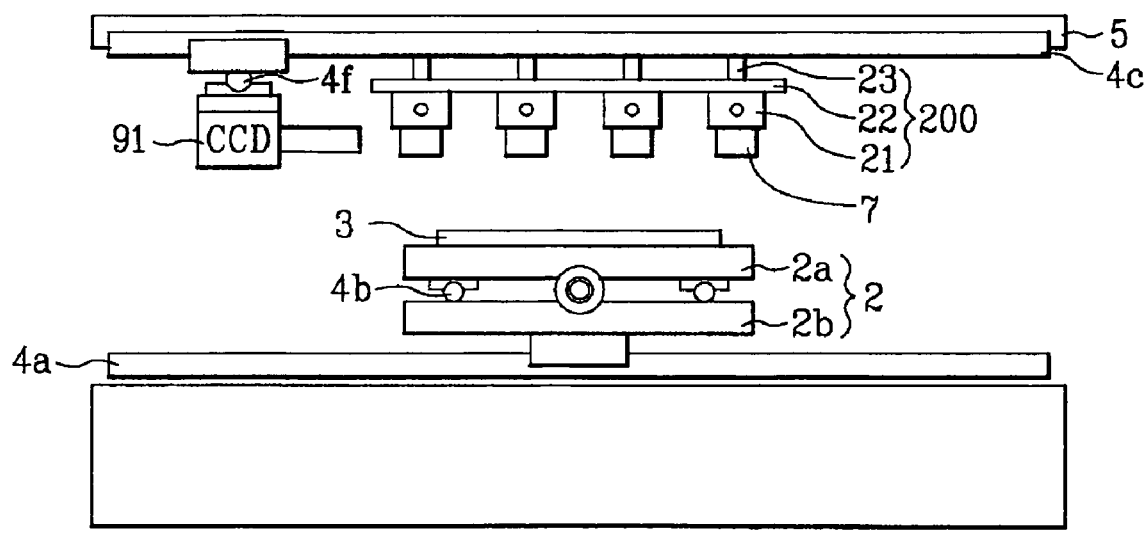
FIG. 10 illustrates a step for monitoring a spray state of a nozzle in accordance with a preferred embodiment of the present invention.

Referring to FIG. 10, a state in which the nozzles 52 spray the pattern forming solution is monitored in real time by using the CCD camera 94. The CCD camera 94 is also movable in left/right directions along the rail 4c, and 4f.

Figure 11:
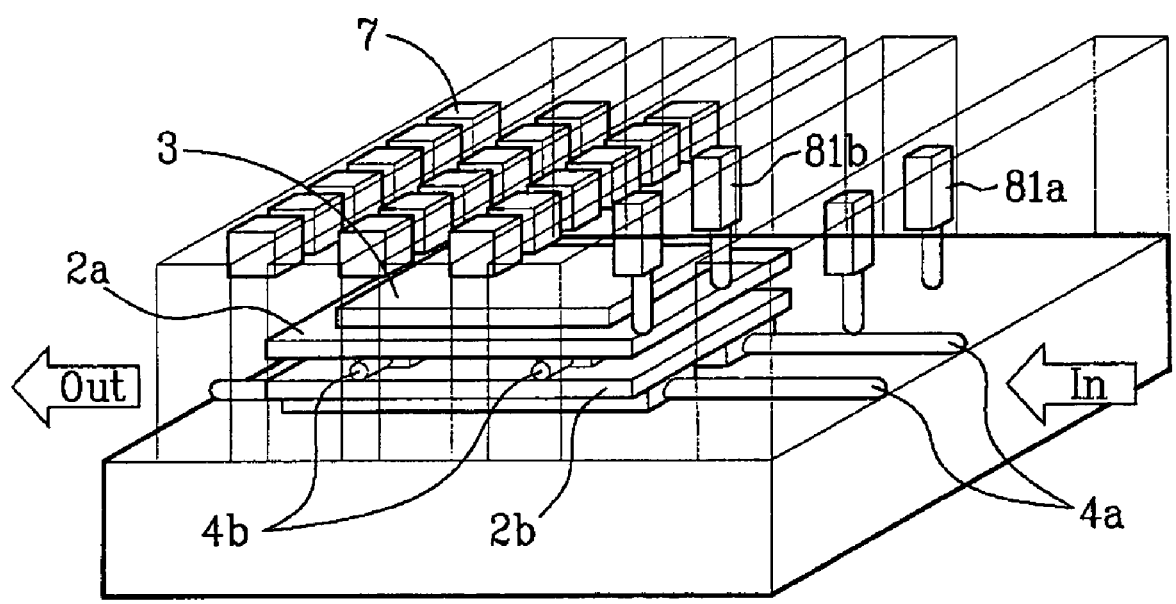
FIG. 11 illustrates a perspective view of a device for fabricating a display panel having an ink-jet printing applied thereto in accordance with a preferred embodiment of the present invention.

Referring to FIG. 11, after formation of the patter 51 is finished, the substrate 3 is inspected (S7). Then, the process proceeds to the next process, i.e., if it is assumed that it is a process for forming the R, G, B filter, for carrying out heat treatment for hardening the pattern forming solution sprayed onto the substrate 3, the substrate 3 are moved to a baking oven along a rail in line (S8).

As has been explained, the device and method for fabricating a display panel having ink-jet printing applied thereto of the present invention have the following advantages.

By turning the ink-jet heads by an angle according to intervals of patterns, display panels with different resolutions can be fabricated. Therefore, a fabrication cost can be saved.

The once through formation of the pattern by spraying the pattern forming solution, a fabrication time period can be reduced, and fabrication process can be simplified.

The spray of solution for forming a pattern permits to improve step coverage, to form uniform patterns.

The present invention is applicable, not only to the color filter process of a display panel, but to all processes, such as fluorescent material coating, formation of electrode and spacer, and the like.

It will be apparent to those skilled in the art that various modifications and variations can be made in the device and method for fabricating a display panel having ink-jet printing applied thereto of the present invention without departing from the spirit or scope of the invention. Thus, it is intended that the present invention cover the modifications and variations of this invention provided they come within the scope of the appended claims and their equivalents.

What is claimed is:

1. A device for fabricating a display panel having a solution applied thereto, comprising:
    a stage for supporting a substrate;
    a base having at least one rail for transporting the stage;
    at least one head rotatable by an angle for spraying a pattern forming solution on the substrate; and
    a head control means for controlling a rotation angle of the at least one head according to intervals of the patterns to be formed,
    wherein the head control means includes at least one head holder, each of the at least one head holder for holding one of the at least one head, and a plurality of gears, each of the plurality of gears connected to a center shaft of one of the at least one head holder and engaged with each of the plurality of gears for rotating the at least one head holder.

2. A device for fabricating a display panel comprising:
    a stage for supporting a substrate;
    a base having at least one rail for transporting the stage;
    a plurality of heads wherein each head has a plurality of nozzles for spraying a pattern forming solution on the substrate;
    a head controlling means for rotating the plurality of heads by a preset angle according to intervals of patterns to be formed;
    a cleaning means for cleaning the heads; and
    at least one camera for monitoring the substrate and the plurality of nozzles,
    wherein the stage includes; an upper plate, a lower plate, and rails between the upper and lower plate disposed perpendicular to the at least one rail on the base.

3. The device of claim 2, wherein the head controlling means turns the heads by a preset angle with reference to a direction perpendicular to a length direction of the patterns to be formed.

4. The device of claim 3, wherein the head controlling means increases the preset angle as the intervals between the patterns become smaller.

5. The device of claim 2, wherein the head controlling means includes head holders for holding the heads and two support plates for supporting the head holders.

6. The device of claim 2, wherein the at least one camera are CCD cameras for monitoring positions of the substrate and the nozzles and spraying action of the nozzles.

7. The device of claim 2, further comprising a head support having rails for transporting the plurality of heads.

8. A device for fabricating a display panel comprising:
    a stage for supporting a substrate;
    a base having at least one rail for transporting the stage;
    a plurality of heads wherein each head has a plurality of nozzles for spraying a pattern forming solution on the substrate;
    a head controlling means for turning the heads by a preset angle according to intervals of patterns intended to form;
    a cleaning means for cleaning the heads; and
    at least one camera for monitoring the substrate and the plurality of nozzles,
    wherein the head control means includes a plurality of head holders, each of the plurality of head holders for holding the heads, and a plurality of gears, each of the plurality of gears connected to a center shaft of one of the plurality of head holders and engaged with each of the plurality of gears for rotating the plurality of head holders.

9. The device claim 8, wherein the plurality of heads is movable in a vertical direction relative to the substrate.

10. A device for fabricating a display panel comprising:
    a stage for supporting a substrate;
    a base having at least one rail for transporting the stage;
    a plurality of heads each having a plurality of nozzles for spraying a pattern forming solution on the substrate;
    a head controlling means for rotating the plurality of heads by a preset angle
    according to intervals of patterns to be formed;
    a cleaning means for cleaning the heads; and
    at least one camera for monitoring the substrate and the plurality of nozzles,
    wherein the cleaning means is movable along the at least one rail on the base for capping the plurality of nozzles when the plurality of heads are not in use.

11. The device of claim 10, wherein the head controlling means rotates the plurality of heads by a preset angle with reference to a direction perpendicular to a length direction of the patterns to be formed.

12. The device of claim 11, wherein the head controlling means increases the preset angle as the intervals between the patterns become smaller.

13. The device of claim 10, wherein the head controlling means includes head holders for holding the plurality of heads and two support plates for supporting the head holders.

14. The device of claim 10, wherein the plurality of heads is movable in a vertical direction relative to the substrate.

15. The device of claim 10, wherein the at least one camera are CCD cameras for monitoring positions of the substrate and the nozzles and spraying action of the nozzles.

16. The device of claim 10, further comprising a head support having rails for transporting the plurality of heads.

* * * * *